US008457362B2

(12) United States Patent
Komoto

(10) Patent No.: US 8,457,362 B2
(45) Date of Patent: Jun. 4, 2013

(54) IMAGE INSPECTING APPARATUS

(75) Inventor: Masahiro Komoto, Toride (JP)

(73) Assignee: Canon Kabushiki Kaisha, Tokyo (JP)

( * ) Notice: Subject to any disclaimer, the term of this patent is extended or adjusted under 35 U.S.C. 154(b) by 483 days.

(21) Appl. No.: 12/404,242

(22) Filed: Mar. 13, 2009

(65) Prior Publication Data

US 2009/0245589 A1 Oct. 1, 2009

(30) Foreign Application Priority Data

Mar. 25, 2008 (JP) ................................ 2008-078276

(51) Int. Cl.
*G06K 9/00* (2006.01)
*H03F 1/26* (2006.01)
*H04B 15/00* (2006.01)
*G06F 15/16* (2006.01)

(52) U.S. Cl.
USPC .......................................... 382/112; 702/193

(58) Field of Classification Search
USPC .......................................... 382/112; 702/193
See application file for complete search history.

(56) References Cited

U.S. PATENT DOCUMENTS 6,339,685 B1 * 1/2002 Okamoto et al. ............... 399/16
6,804,473 B2 10/2004 Nakamura
2003/0234960 A1 * 12/2003 Kaltenbach et al. .......... 382/112
2003/0235328 A1 * 12/2003 Nakamura et al. ............ 382/112
2004/0146202 A1 * 7/2004 Hyoki ........................... 382/209
2008/0075476 A1 * 3/2008 Nakazato et al. ............... 399/15

FOREIGN PATENT DOCUMENTS

JP 08-317170 A 11/1996
JP 2002-178609 A 6/2002
JP 2004-020650 A 1/2004
JP 2005-043235 * 2/2005
JP 2005-043235 A 2/2005
JP 2005-178060 A 7/2005
JP 2005-271297 A 10/2005
JP 2006-082924 A 3/2006
JP 2006-190545 * 7/2006
JP 2007-148027 A 6/2007
JP 2007-327074 * 12/2007

* cited by examiner

*Primary Examiner* — Greta Robinson
*Assistant Examiner* — Brian E. Weinrich
(74) *Attorney, Agent, or Firm* — Canon USA, Inc., IP Division

(57) ABSTRACT

An image inspecting apparatus includes a receiving unit configured to receive the sheet from the image forming section; a reading unit configured to read the image formed on the sheet received by the receiving unit; an inspection unit configured to inspect the image read by the reading unit; and a sheet stack portion configured to temporarily stack the sheet read by the reading unit and to eject the stacked sheet, the sheet stack portion stacking the sheet so as to obtain a time to be used for inspecting the image by the inspection unit.

19 Claims, 12 Drawing Sheets

IMAGE INSPECTING APPARATUS

BACKGROUND OF THE INVENTION

1. Field of the Invention

The present invention relates to an image inspecting apparatus which inspects an image output by an image forming apparatus.

2. Description of the Related Art

An image inspecting apparatus has been known which uses image information obtained by reading an image formed on a sheet with an image reading unit and inspects whether the image is good or defective using the image information. For example, Japanese Patent Laid-Open No. 2005-043235 discloses a configuration which discriminates a disorder or the like at a line portion of a formed image, and Japanese Patent Laid-Open No. 2007-148027 discloses a configuration which discriminates a "contamination", "color reproducibility", etc., of a formed image. As an image to be formed is becoming complicated and image quality is being desired to increase, inspection accuracy is also desired to increase. Hence, a time necessary for the inspection increases.

In addition, Japanese Patent Laid-Open No. 2004-suggests an image forming apparatus. When formation of a defective image is recognized, the image forming apparatus outputs an image, which is formed in accordance with the same recording information as that used when the defective image is formed, and the image forming apparatus rearranges the order of sheets correctly in the image forming apparatus.

In many image forming apparatuses of electrophotographic type and inkjet type, when an image forming operation is intermittently performed, a certain time is required from suspension to resumption of the image forming operation. Accordingly, the number of image-formed sheets per unit time (productivity) may decrease. For example, when the image forming operation is intermittently performed when sets of a plurality of sheets are printed, the productivity seriously decreases. Thus, in a case where the image forming operation is performed simultaneously with an inspection at an image inspecting apparatus, if an image inspecting speed (the number of inspected sheets per unit time) is slow as compared with the productivity of the image forming apparatus, the continuous image forming operation has to be suspended, or the productivity of the image forming apparatus has to decrease. Also, if the image inspecting speed is controlled to be within a continuously image-forming speed (the number of image-formed sheets per unit time), the number of inspection items and accuracy of the inspection are limited.

SUMMARY OF THE INVENTION

The present invention provides an image inspecting apparatus that addresses the above-described problems.

Also, the present invention provides an image inspecting apparatus that does not suspend a continuous image forming operation even when an image inspecting speed is slower than an image forming speed.

Further, the present invention provides an image inspecting apparatus that can perform an inspection with high accuracy even when the image inspecting speed is slower than the image forming speed.

According to a first aspect of the invention, an image inspecting apparatus is provided which is configured to inspect an image formed on a sheet ejected from an image forming section. The image inspecting apparatus includes a receiving unit configured to receive the sheet from the image forming section; a reading unit configured to read the image formed on the sheet received by the receiving unit; an inspection unit configured to inspect the image read by the reading unit; and a sheet stack portion configured to temporarily stack the sheet read by the reading unit and to eject the stacked sheet, the sheet stack portion stacking the sheet so as to obtain a time to be used for inspecting the image by the inspection unit.

Further features of the present invention will become apparent from the following description of exemplary embodiments with reference to the attached drawings.

DESCRIPTION OF THE EMBODIMENTS

Figure 3:
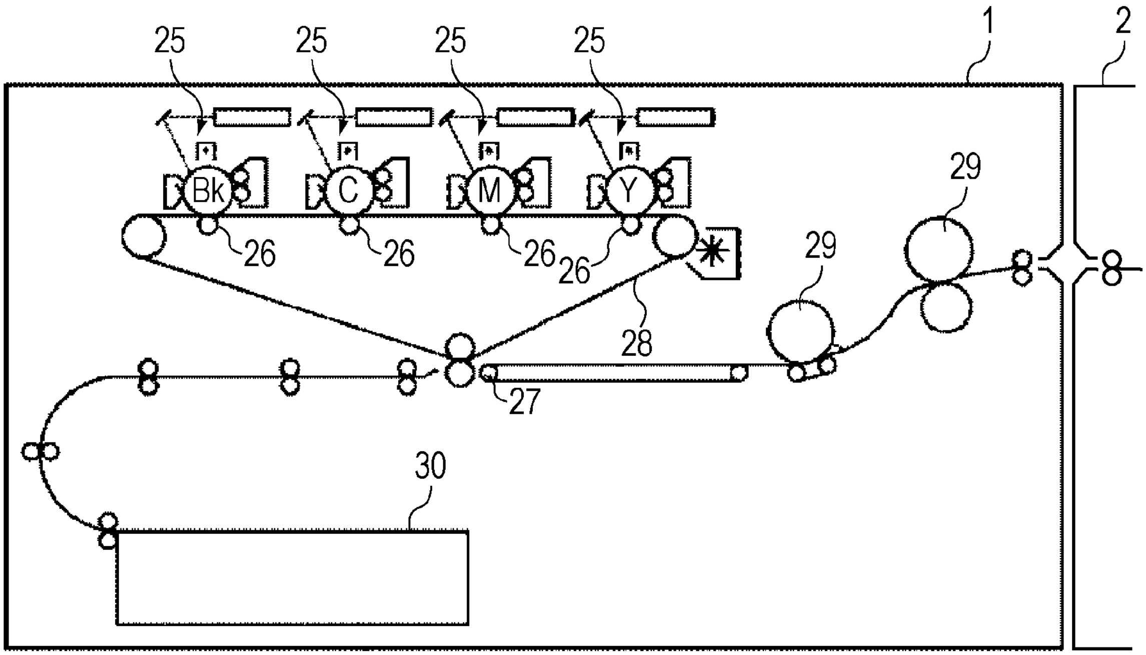
FIG. 3 is a cross-sectional view showing a brief configuration of an image forming apparatus.

FIG. 3 shows the overview of an image forming apparatus applicable to the present invention. The operation of the image forming apparatus is described below. In this embodiment, an electrophotographic full-color image forming apparatus is used.

Four image forming stations 25 each include a developing device, a charging device, and a photosensitive member. The image forming stations 25 form toner images of colors of yellow, magenta, cyan, and black on the photosensitive members, respectively. The toner images of the respective colors formed by the image forming stations 25 are sequentially transferred by primary transfer units 26 onto an intermediate transfer member 28. The toner images are superposed on each other on the intermediate transfer member 28, and hence, a full-color toner image is formed. The toner image formed on the intermediate transfer member 28 is conveyed to a secondary transfer unit 27 by rotation of the intermediate transfer member 28. At the secondary transfer unit 27, the toner image is transferred onto a sheet conveyed from a feeding device 30. The sheet on which the toner is transferred is conveyed to a fixing unit 29. At the fixing unit 29, the toner is heated and fixed to the sheet. The sheet which has passed through the fixing unit 29 is ejected from an image forming apparatus 1, and conveyed to an image inspecting apparatus 2. Although the image forming apparatus and the image inspecting apparatus are separately provided in this embodiment, the invention may be applied to an image forming apparatus having an image inspecting function.

Figure 1:
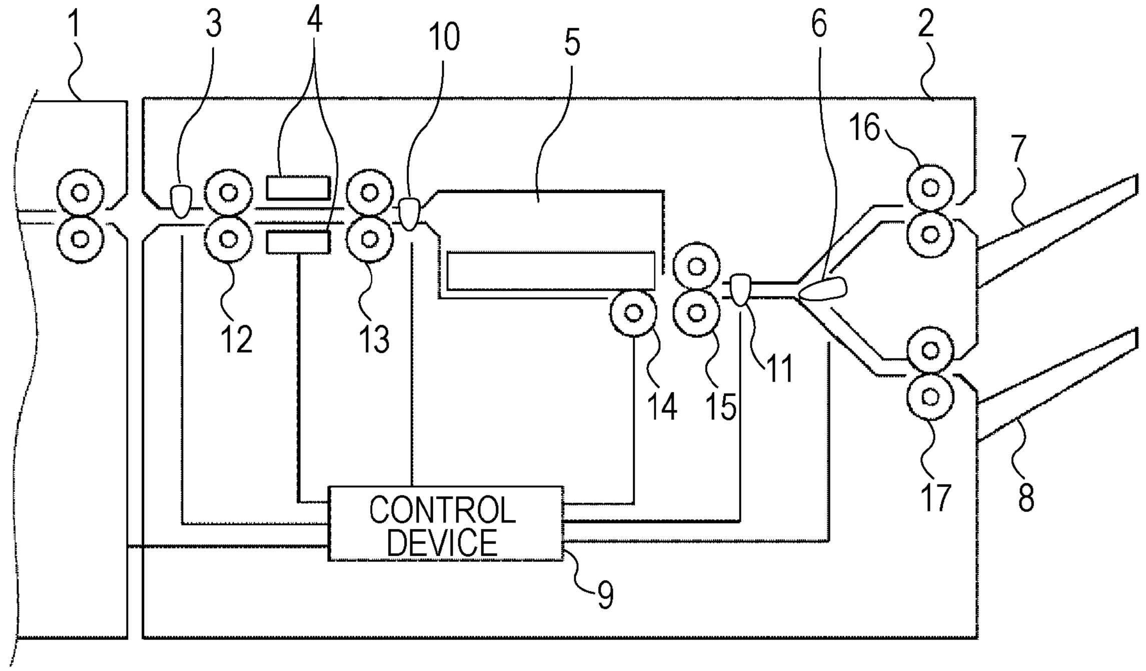
FIG. 1 is a cross-sectional view showing a brief configuration of an image inspecting apparatus.

FIG. 1 provides a schematic illustration of the image inspecting apparatus 2 according to the embodiment of the invention. The image inspecting apparatus 2 in FIG. 1 includes a sheet detection sensor 3, an image reading sensor 4, a sheet stack portion 5, a sheet-sorter movable guide 6, a control device 9, a good-product ejection portion 7, and a defective-product ejection portion 8.

Figure 2:
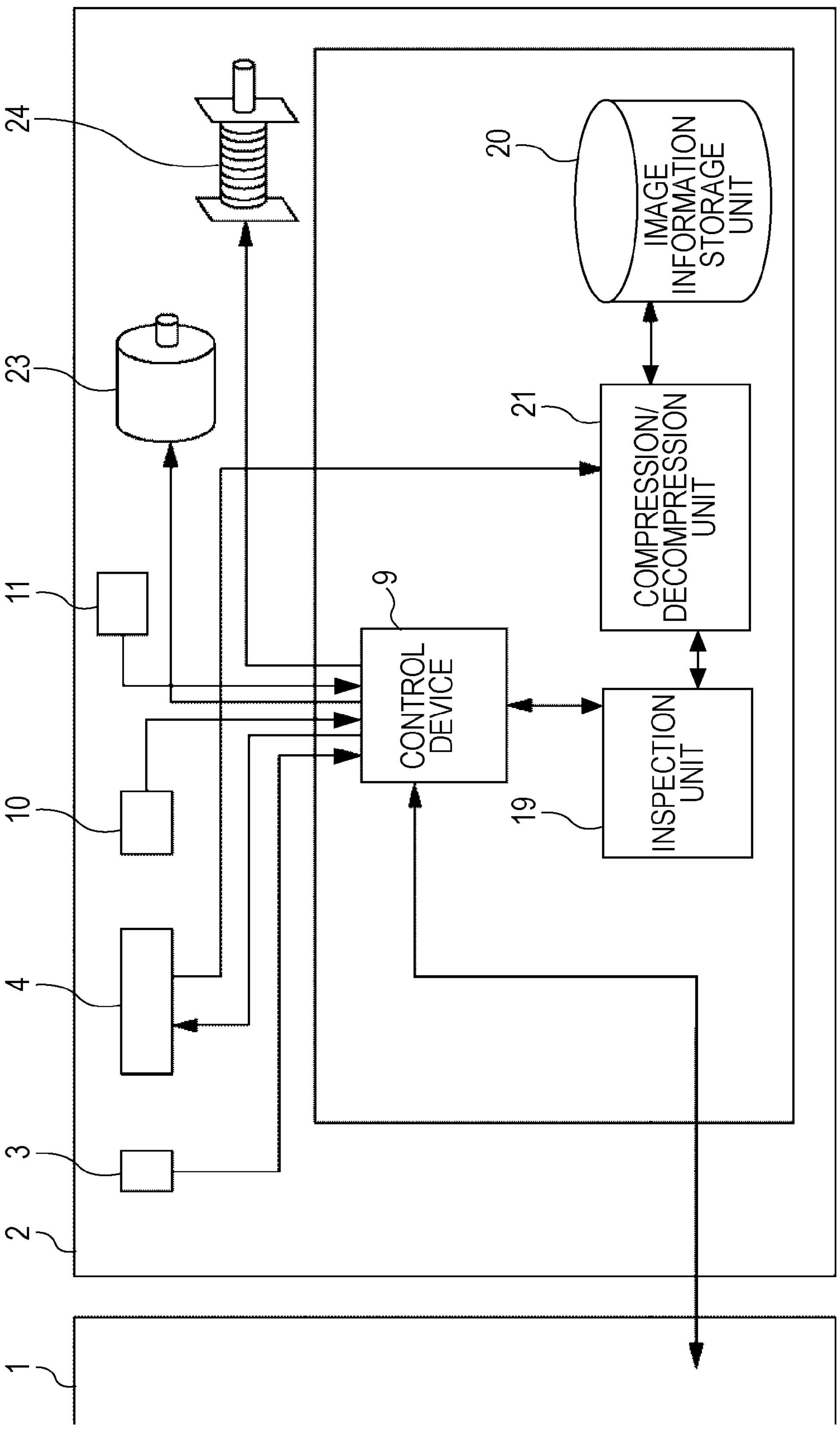
FIG. 2 is a block diagram showing a control device.

The image reading sensor 4 photoelectrically converts an image output from the image forming apparatus 1 and reads the converted image. In this embodiment, the image reading sensor 4 is formed of a pair of contact image sensors (CISs) for a front surface and a back surface of a sheet. The image reading sensor 4 is a one-dimensional line sensor. Since a sheet is conveyed, the image reading sensor 4 reads two-dimensional image information. The image reading sensor 4 is connected to the control device 9. The read image information is sent to an image information storage unit 20 (FIG. 2).

On the sheet stack portion 5, a sheet conveyed from the image forming apparatus 1 is temporarily stacked. The sheet stack portion 5 allows a sheet which has passed through the image reading sensor 4 to be stacked on the top of a stacked bundle of sheets and a sheet at the bottom to be ejected. That is, first-in first out system is used, in which a sheet is ejected in a stacked order. The sheet stack portion 5 stacks the sheet so as to obtain a time to be used for inspecting the image by an inspection unit 19 to be hereinafter described.

The sheet-sorter movable guide 6 is a mechanism which sorts sheets from the sheet stack portion 5 to the good-product ejection portion 7 and the defective-product ejection portion 8. The sheet-sorter movable guide 6 is driven by a sorter-movable-guide driving electromagnet 24, though not shown in FIG. 1, which is operated in response to a signal from the control device 9. The direction of the sheet-sorter movable guide 6 is switched by the sorter-movable-guide driving electromagnet 24. The good-product ejection portion 7 and the defective-product ejection portion 8 allow to inspected sheets to be stacked thereon. FIG. 1 illustrates simple structures to allow sheets to be merely stacked thereon. However, post-processing devices having, for example, a stapling function, may be connected.

In the image inspecting apparatus 2, the sheet detection sensor 3 detects a leading edge of the sheet ejected from the image forming apparatus 1. In the image inspecting apparatus 2, the sheet passes through the image reading sensor 4 by way of rollers 12 and 13 on the basis of the detection information from the sheet detection sensor 3. The image reading sensor 4 reads image information formed on the sheet passing therethrough. Then, in the image inspecting apparatus 2, the sheet is conveyed to the sheet stack portion 5 so as to be stacked on the top of the stacked sheets. A sheet sensor 10 is used to count the number of sheets stacked on the sheet stack portion 5. In the image inspecting apparatus 2, a sheet stacked on the sheet stack portion 5 and located at the bottom is ejected one by one by way of rollers 14 and 15. In the image inspecting apparatus 2, the direction of the sheet-sorter movable guide 6 is set on the basis of the determination whether the image inspection result is good or defective. The direction of the sheet-sorter movable guide 6 is switched by the sorter-movable-guide driving electromagnet 24 (described later) when a predetermined time has elapsed after a sheet sensor 11 detects the leading edge of the sheet. The sorted sheet is ejected to the good-product ejection portion 7 by rollers 16, or to the defective-product ejection portion 8 by rollers 17.

FIG. 2 is a block diagram showing the configuration of the image inspecting apparatus 2. The control device 9 controls the image reading sensor 4, the sheet stack portion 5, and the sheet-sorter movable guide 6. The image information storage unit 20 is a storage device which temporarily stores image information of a plurality of sheets read by the image reading sensor 4. In this embodiment, the image information storage unit 20 employs a magnetic recording device (HDD). Instead of the magnetic recording device, a semiconductor recording device may be used depending on an image reading speed. It is inefficient in storing the image information directly from the image reading sensor 4 to the image information storage unit 20. Hence, a compression/decompression unit 21 is provided. To store an image, the compression/decompression unit 21 compresses the images, and then stores the image information in the image information storage unit 20. To read an image, the compression/decompression unit 21 decompresses the image information, and then transfers the image information to an inspection unit 19. The inspection unit 19 is a circuit for inspection processing relating to image quality. The inspection unit 19 receives the image information from the image information storage unit 20 through the compression/decompression unit 21, determines whether the image is good or defective, and transmits the result to the control device 9. Alternatively, the inspection unit 19 may be omitted, and the control device 9 may inspect an image. Also, the image forming apparatus 1 and the image inspecting apparatus 2 may be integrated.

The control device 9 contains a communication unit with respect to the image forming apparatus 1. The control device 9 acquires the condition of the image forming apparatus 1, and transmits a request of suspension of image printing and a request of re-printing image to the image forming apparatus 1.

In addition, the control device 9 sends a reading start signal to the image reading sensor 4, rotationally drives the stack-portion sheet ejecting motor 23 to cause the sheet to be ejected from the sheet stack portion 5 by the rollers 13, and drives the sorter-movable-guide driving electromagnet 24 to switch the sheet-sorter movable guide 6.

Figure 4:
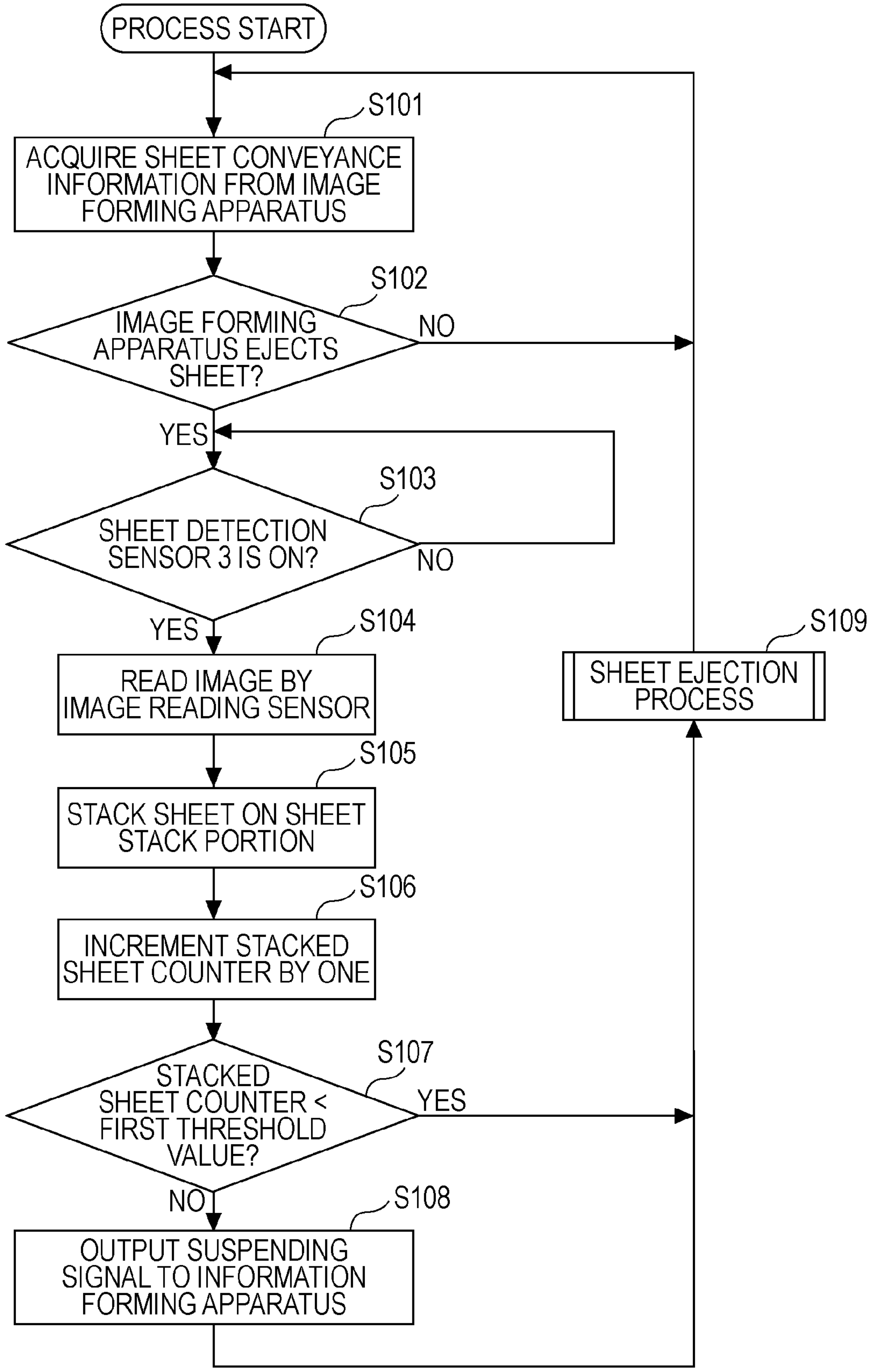
FIG. 4 is a flowchart showing a sheet stack process of the control device.
Figure 5:
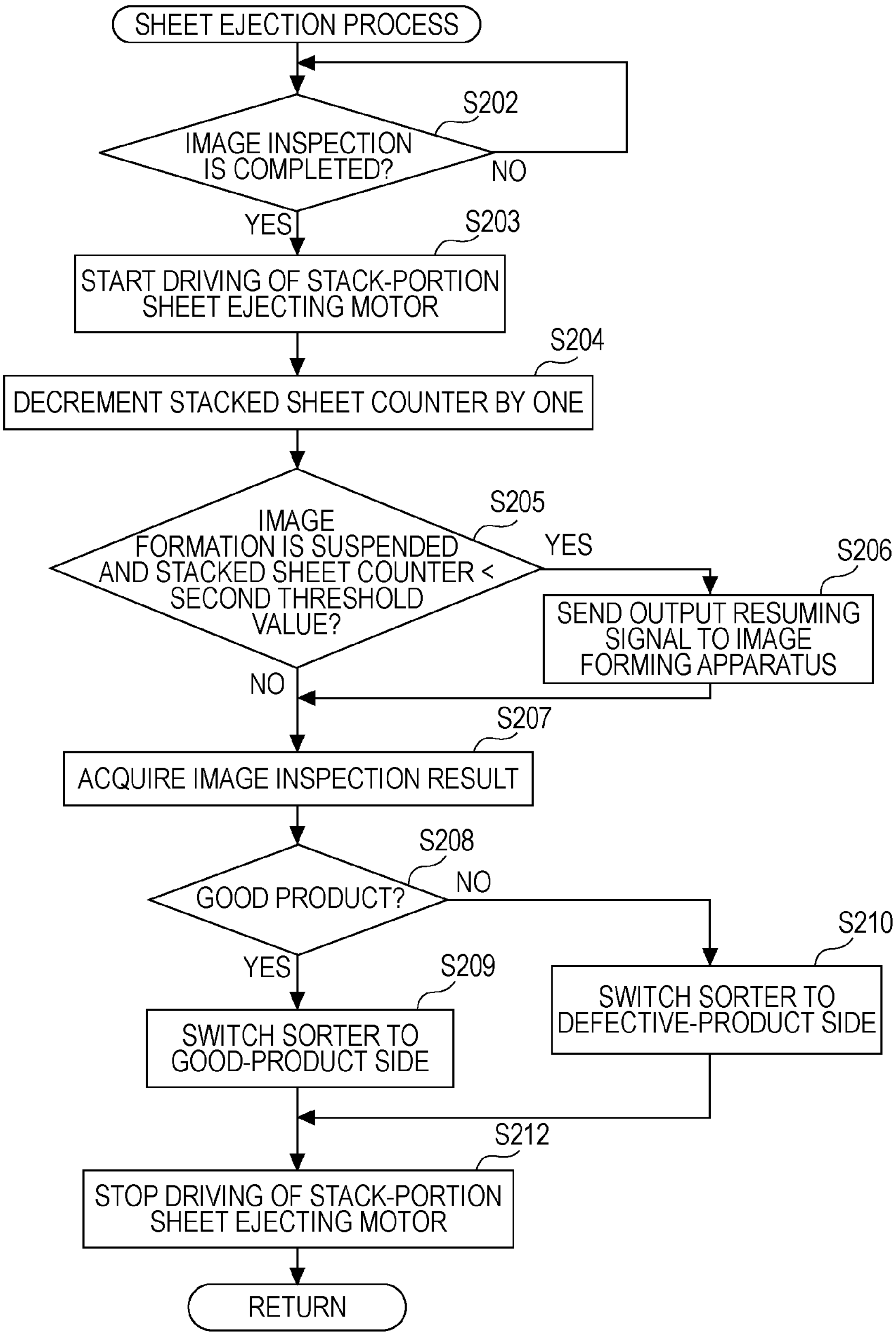
FIG. 5 is a flowchart showing a sheet ejection process of the control device.

FIGS. 4 and 5 show flowcharts of control of the control device 9 according to this embodiment.

FIG. 4 shows a sheet stack process. The control device 9 acquires sheet conveyance information (size of the sheet, simplex or duplex printing, and timing of conveyance) from the image forming apparatus 1 (S101). The control device 9 determines whether or not a sheet conveyance signal is sent from the image forming apparatus 1 (S102), and repeats step S101 until the signal is sent. When the control device 9 receives the signal of the sheet conveyance information from the image forming apparatus 1, the control device 9 determines arrival of the sheet on the basis of the output from the sheet detection sensor 3 (S103). The control device 9 determines an image range as an inspection subject on the sheet on the basis of the detection timing of the sheet by the sheet detection sensor 3, and reads image information using the image reading sensor 4 (S104). The image information read by the image reading sensor 4 is compressed by the compression/decompression unit 21, and saved in the image information storage unit 20. The control device 9 then conveys the sheet to the sheet stack portion 5 using the rollers 13. At this time, the sheet sensor 10 sends a signal to a stacked sheet counter in the control device 9 when the sheet passes through the sheet sensor 10, thereby incrementing a value of the number of sheets stacked on the sheet stack portion 5 by one (S105, S106). The stacked sheet counter is an up/down counter. The control device 9 determines whether the value of the stacked sheet counter is smaller than a predetermined first threshold value (S107). If the value of the stacked sheet counter is smaller than the first threshold value, the control device 9 performs a sheet ejection process (S109). The sheet ejection process will be described later in detail. In contrast, if the value of the stacked sheet counter is the first threshold value or greater, the control device 9 sends an output suspending signal of the image forming operation to the image forming apparatus 1 (S108), and then performs the process in step S109. By the process in step S108, the image forming apparatus 1 suspends image formation on the sheet. The conveyance of the sheet to the image inspecting apparatus 2 is also suspended. Thusly, the control device 9 controls the number of stacked sheets on the sheet stack portion 5 to be within the capacity.

FIG. 5 shows the detail of the sheet ejection process in step S109. The process in step S109 relates to sheet ejection after the image inspection. Sheets after the image inspection are conveyed from the sheet stack portion 5 one by one, and the sheets are sorted by the sheet-sorter movable guide 6 in accordance with the image inspection results to the good-product ejection portion 7 and the defective-product ejection portion 8. While step S109 is illustrated at a position shown in FIG. 4, step S109 may be executed in a time sharing manner with steps S101 to S108.

The control device 9 determines whether or not the image inspection is completed in the inspection unit 19 (S202). In particular, the control device 9 monitors an image inspection completion signal from the inspection unit 19. When the image inspection is completed, the control device 9 drives the stack-portion sheet ejecting motor 23 to convey a sheet at the bottom of the sheet stack portion 5 (S203), and decrements the value of the stacked sheet counter by one on the basis of a signal sent from the sheet sensor 11 when the sheet sensor 11 detects passage of the sheet (S204). The control device 9 determines whether the value of the stacked sheet counter is smaller than a second threshold value (S205). If the value of the stacked sheet counter reaches the first threshold value in step S107, and then, the value becomes smaller than the second threshold value in step S205, the control device 9 sends an output resuming signal to the image forming apparatus 1 to resume the image forming operation (S206). Accordingly, the output of the sheet from the image forming apparatus 1 to the image inspecting apparatus 2 is resumed. Then, the control device 9 acquires the image inspection result from the inspection unit 19 (S207). The control device 9 determines whether or not the image inspection result indicates a good product (predetermined quality) (S208). If the determination indicates the good product, the control device 9 switches the sheet-sorter movable guide 6 to a good-product-ejection-portion 7 side, so that the sheet is conveyed to the good-product ejection portion 7 (S209). If the determination indicates the defective product, the control device 9 switches the sheet-sorter movable guide 6 to a detective-product-ejection-portion 8 side, so that the sheet is conveyed to the defective-product ejection portion 8 (S210). When the sheet ejection process is ended, the control device 9 stops the stack-portion sheet ejecting motor 23 and prepares for a next sheet ejection process (S212). The second threshold value is smaller than the first threshold value. In this embodiment, the first threshold value is 52, and the second threshold value is 26, which is half of the first threshold value. If first and second threshold values are similar values or the same values, the image forming apparatus 1 may repeat an operation of outputting several sheets, being suspended, and then outputting several sheets. Such an intermittent operation may reduce the life of expendable parts of the image forming apparatus 1. This is not desirable. Like this embodiment, the problem of the life due to the intermittent operation can be improved by providing a sufficient difference between the first and second threshold values.

Next, an image inspecting process of the inspection unit 19 in this embodiment is described. In this embodiment, example inspection items of the image inspecting process are "image lack", "fog", "disorder", and "color reproducibility". However, inspection items of the image inspecting process to which the present invention is applied are not limited thereto. Some of the inspection items of the image inspecting process listed above are inspected by comparing image information formed on a sheet (inspection image) with a reference image.

First, an inspecting method of fog is described. The fog is a phenomenon in which a toner excessively adheres to a non-image part on a sheet. Image data is binarized (black pixel value is one, white pixel value is zero) to be binary image data. Then, a black pixel region of the inspection image is expanded by, for example, five pixels. A normally printed part and a fog part in the inspection image are extracted as subject pixel regions. Total numbers of pixels are counted respectively for the subject pixel regions. Then, it is determined whether each total number of pixels is a predetermined threshold value or smaller. The total number of pixels in the fog part is smaller than the total number of pixels in the normally printed part. Hence, this method determines whether the subject pixel region is the normally printed part or an erroneously printed part (fog). In a region in which small black pixels are closely arranged, such as a small character, when pixels are expanded, the pixels are connected to each other and define a large subject pixel region. Such a region is not detected as an erroneously printed part.

Next, an inspecting method of image lack is described. The image lack is a phenomenon in which image information has a non-print part (lack region) on a sheet. The inspecting method uses line information such as a width of a line and a size of a dot. The line information is included in page description language (PDL) describing, for example, a width of a line, and a connecting method of a base point and an end point. The control device 9 acquires line information from data obtained by converting PDL into bitmap data, and sends the line information to the inspection unit 19. Data obtained by binarizing the image information read by the image reading sensor 4 is compared with the line information sent from the control device 9. The inspection unit 19 searches for an information lack part, detects an area (size) of the lack part, in particular, the number of pixels in the lack part, and determines whether the image lack is present or not through the comparison.

Next, an inspecting method of disorder is described. The disorder is a phenomenon which is not as bad as the image lack, but a line or a dot in a formed image is larger or smaller by a predetermined level than a line or a dot in an original image. If a disorder appears in a formed image, such as a bar code, the bar code may be erroneously recognized, or the bar code cannot be recognized. The disorder is determined by assuming a pair of adjacent pixels as a group, and calculating a rate of shifting of a group in the image read by the image reading sensor 4 with respect to a group in the original image. In particular, a ratio of the number of pixels in the output image to the number of pixels in the original image is assumed as a disorder amount. The disorder amount is compared with a predetermined threshold value, and it is determined whether the disorder is present or not. The disorder amount is calculated using the following expression (Expression (1)):

$$\text{disorder amount}=|(\text{output number of pixels}/\text{reference number of pixels})\times 100-100|(\%) \quad (1)$$

In this embodiment, when the disorder amount is 50% or higher, it is determined that the disorder is present. In general, the disorder may appear at an edge part of a toner image on a sheet. That is, the disorder amount likely decreases when a dot or a line in the original image is larger or thicker than a predetermined value. Hence, the threshold value for determining whether or not the disorder is present may be changed depending on an area of an image to be formed.

Next, an inspecting method of color reproducibility is described. The color reproducibility is not accuracy of color matching, but is color stability during image formation. In raster image processing (RIP), color matching is performed using a source profile and a printer profile. Original image data may use image data of the L*a*b color space. The image data of the L*a*b color space is obtained through conversion of multi-valued image data input to the image forming apparatus 1.

Similarly, image data read by the image reading sensor 4 is also converted from multi-valued image data into image data of the L*a*b color space. To inspect color reproducibility, color reproducibility of a graphic part of an illustration or an image part of a photograph is inspected. An evaluation method for the color reproducibility inspection uses a CIE 1976 color difference formula (Expression (2)) achieved by International Commission on Illumination (CIE). Alternatively, CIE 1994 color difference formula regarding visibility, or CIE 2000 color difference formula may be used.

$$\text{color difference}(\Delta E)=((Lt-Ls)2+(at-as)2+(bt-bs)2)\ 0.5 \quad (2)$$

where Lt is a brightness of the original image (reference brightness), Ls is a brightness of the output image (output brightness), at is a value of a* of the original image (reference a*), as is a value of a* of the output image (output a*), bt is a value of b* of the original image (reference b*), and bs is a value of b* of the output image (output b*).

In the color reproducibility inspection, it is determined whether or not the color difference (ΔE) calculated using Expression (2) is within a predetermined range. Thus, it is determined whether or not the color reproducibility is defective. For example, it is determined that the color reproducibility is defective if at least a color exhibits $\Delta E>5$.

Figure 6:
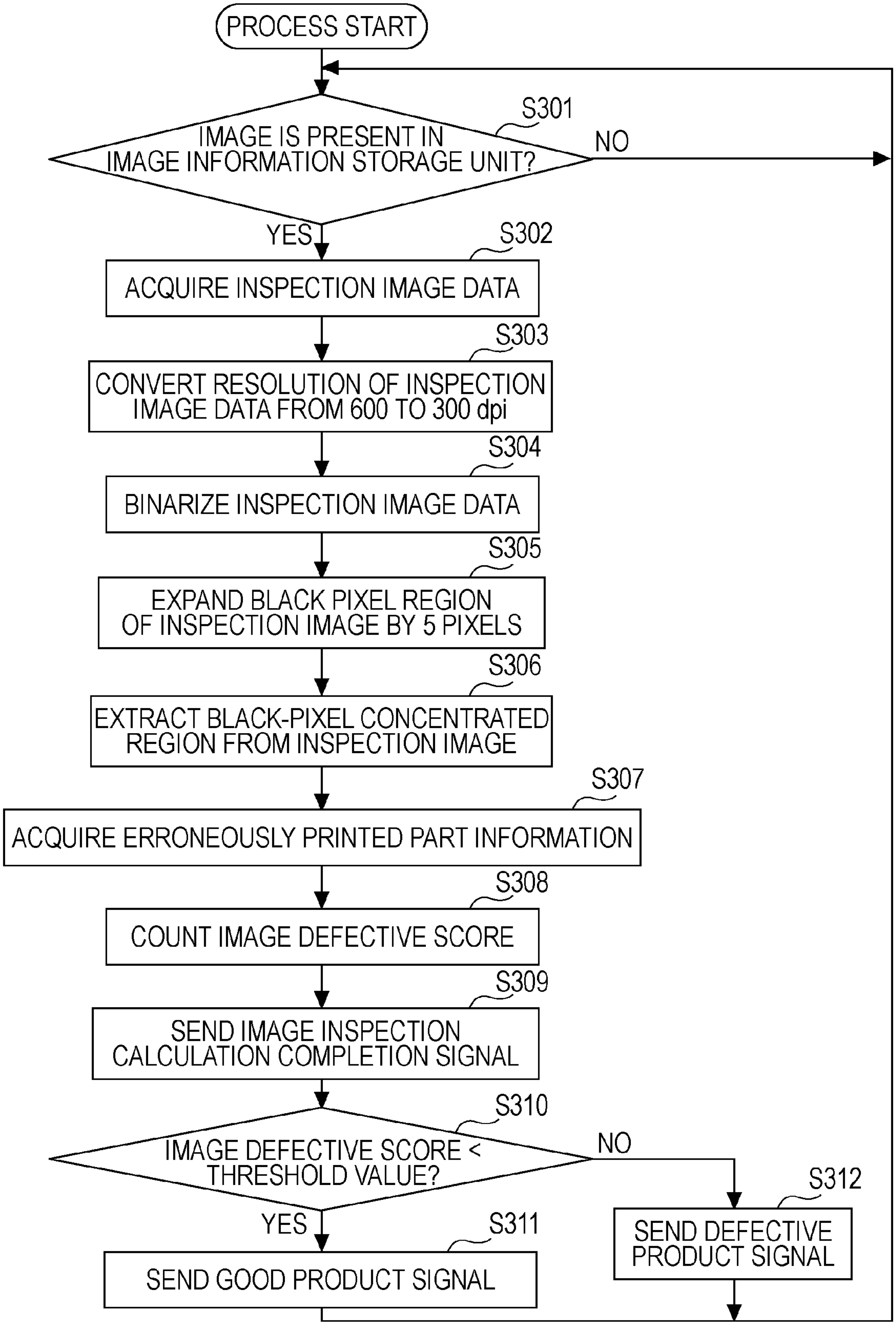
FIG. 6 is a flowchart showing an image inspection calculation process.

In the inspection items described above, the operation of the fog inspection is described as an example inspection of this embodiment. FIG. 6 is a flowchart showing the fog inspection process executed by the inspection unit 19. The inspection unit 19 determines whether or not image information which is not inspected yet is present in the image information storage unit 20 (S301). If the image information which is not inspected is present, the inspection unit 19 acquires inspection image data of a sheet from the image information storage unit 20 through the compression/decompression unit 21 (S302). The inspection unit 19 converts a resolution of the inspection image data as preprocessing (S303). In this embodiment, the resolution is converted from 600 dpi into 300 dpi. Then, the inspection unit 19 binarizes the image data (black pixel value is one, white pixel value is zero) with the resolution thereof converted, thereby providing binary image data (S304). If the data is multi-valued image data having gradations in a range of from 0 to 255, binarization is performed by classifying the gradations by a certain threshold value (for example, 120).

Then, the inspection unit 19 expands a black pixel region of the inspection image, for example, by five pixels to extract a normally printed part and an erroneously printed part in the inspection image, as subject pixel regions (S305). Then, the inspection unit 19 extracts a pixel region formed such that the expanded black pixels are connected to each other (S306). The inspection unit 19 counts total numbers of pixels respectively for the subject pixel regions. Then, the inspection unit 19 determines whether each total number of pixels is a predetermined threshold value or smaller. If the total number of pixels is the threshold value or smaller, the inspection unit 19 determines the subject pixel region as the erroneously printed part (S307). Here, in a region in which small black pixels are closely arranged, such as a small character, when pixels are expanded, the pixels are connected to each other and define a large subject pixel region. Such a region is not detected as an erroneously printed part. The inspection unit 19 determines an image defective score depending on the level of the erroneously printed part, and adds up the score (S308). When the above-described calculation is completed, an image inspection calculation completion signal is sent to the control device 9 (S309). The inspection unit 19 determines whether the image is good or defective by comparing the counted image defective score with a predetermined threshold value (S310). The inspection unit 19 then sends a good product signal or a defective product signal to the control device 9 (S311, S312). When the control device 9 receives the image inspection calculation completion signal, the control device 9 drives the stack-portion sheet ejecting motor 23 to convey a sheet to the sheet-sorter movable guide 6, and drives the sorter-movable-guide driving electromagnet 24 in response to the good product signal or the defective product signal to cause the sheet to be ejected to the good-product ejection portion 7 or the defective-product ejection portion 8.

While an example of the image inspection method is described above, the present invention is not limited to the above-described embodiment, and may be applied to other typical image inspection methods.

Figure 7:
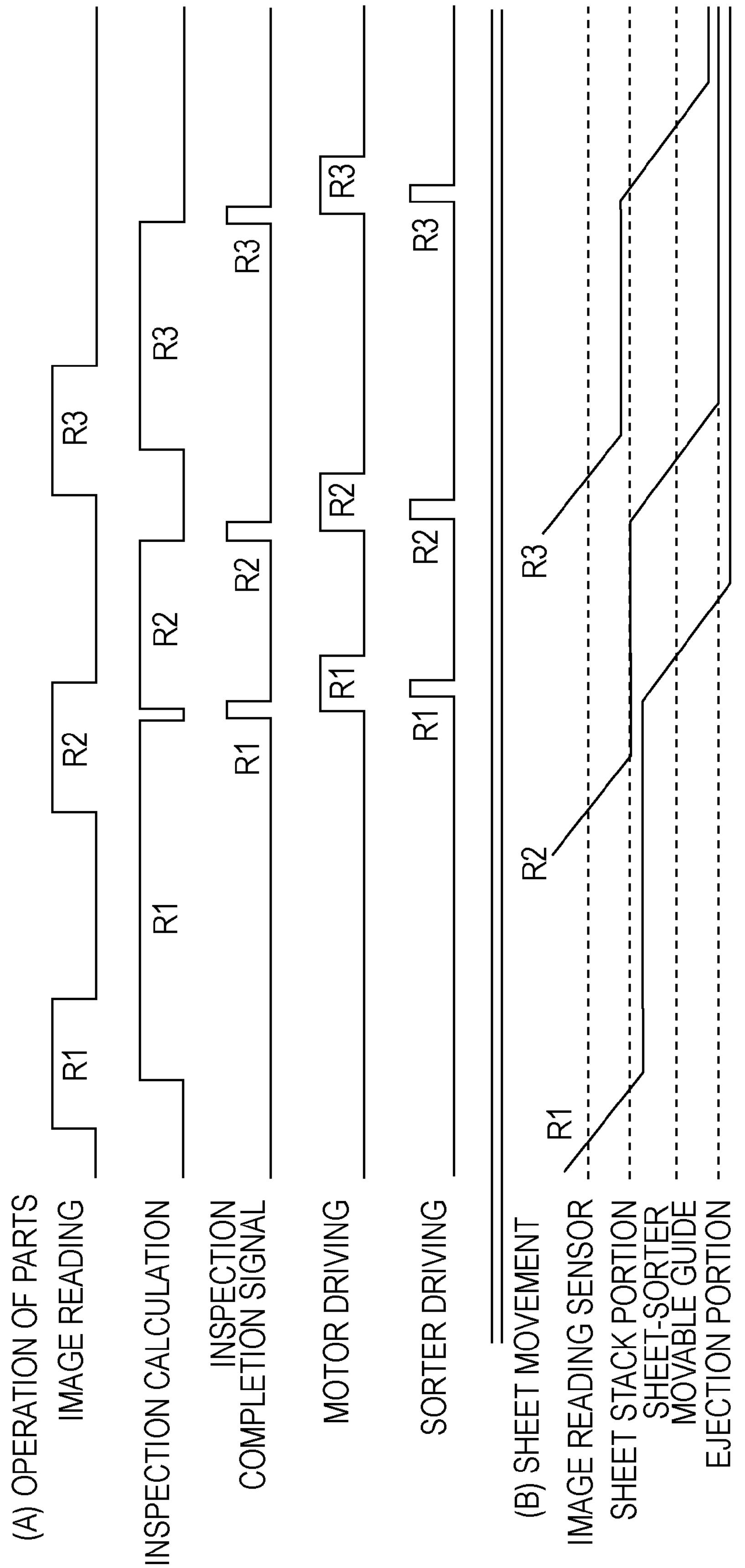
FIG. 7 is a timing chart showing the entire procedure of an image inspection process.

The procedure of the operation of the image inspecting apparatus 2 in this embodiment is described with reference to a timing chart in FIG. 7. Reference characters R1 to R3 in FIG. 7 are provided to discriminate a plurality of sheets to correlate the sheets with movement of the respective parts. Section (A) in FIG. 7 represents the operation of the parts of the image inspecting apparatus 2 described above. The item "image reading" represents a period in which the image reading sensor 4 reads an image on a sheet. The item "inspection calculation" represents a period in which the inspection unit 19 performs an inspection. The item "inspection completion signal" represents a signal to be output to the control device 9 when the inspection unit 19 completes the inspection. The item "motor driving" represents a period in which the stack-portion sheet ejecting motor 23 is rotated. The item "sorter driving" represents a timing at which the sorter-movable-guide driving electromagnet 24 is driven. As shown in FIG. 7, the image forming apparatus 1 ejects a sheet at a predetermined interval. Accordingly, the image reading sensor 4 performs image reading at a predetermined interval. In this embodiment, the contents of the images on the sheets R1 to R3 differ from each other, and hence, the inspection times necessary for the sheets R1 to R3 differ from each other. The inspection is basically started immediately after the image reading is completed. However, if the inspection of the sheet R1 is not completed at the start of reading the sheet R2, the inspection of the sheet R2 is started when the inspection is completed. When the inspection calculation is completed, an inspection completion signal is sent. Immediately after the signal is sent, the stack-portion sheet ejecting motor 23 and the sorter-movable-guide driving electromagnet 24 are driven.

Section (B) in FIG. 7 represents the movement of the sheets R1 to R3 in the image inspecting apparatus 2. The movement is plotted in synchronization with the operation of the respective parts plotted in section (A). Three solid lines correspond to leading edge positions of the three sheets R1 to R3 in a conveying direction. Referring to section (B), it is found that each sheet is conveyed from the image reading sensor 4 to the sheet stack portion 5, stopped at the sheet stack portion 5 until the inspection with the inspection unit 19 is completed, and after the inspection is completed, the sheet is ejected to the good-product ejection portion 7 or the defective-product ejection portion 8 through the sheet-sorter movable guide 6.

Like the sheet R1, even when an inspection calculation time is longer than a sheet conveying interval (time), since the sheet is buffered at the sheet stack portion 5, the image inspection can be performed without suspending the continuous image forming operation of the image forming apparatus 1.

As described above, in this embodiment, even when the time necessary for the inspection calculation for a sheet by the inspection unit 19 is longer than the ejection interval (time) of the sheet of the image forming apparatus 1, the image inspection can be continuously performed without suspending the continuous sheet ejecting operation of the image forming apparatus 1. This increases the degree of freedom of the image inspection process.

In the first embodiment, the sheet is stacked on the sheet stack portion 5 after the sheet ejected from the image forming apparatus 1 is read. Alternatively, the sheet stack portion 5 may be arranged upstream of the image reading sensor 4, so that a sheet ejected from the sheet stack portion 5 is read by the image reading sensor 4.

In the image inspecting apparatus 2, when a defective image is found, an operator has to perform an operation to print the image, which has been determined as a defective image, again. However, if a post-processing device, such as a binding device is connected to the downstream side of the image inspecting apparatus 2, a bound product may miss a page of the defective image. Therefore, when the defective image is produced, the above-mentioned problem can be addressed as long as the image forming apparatus 1 outputs a sheet of the image determined as the defective image again, and the sheet is rearranged in the correct page order in the image inspecting apparatus 2.

Figure 8:
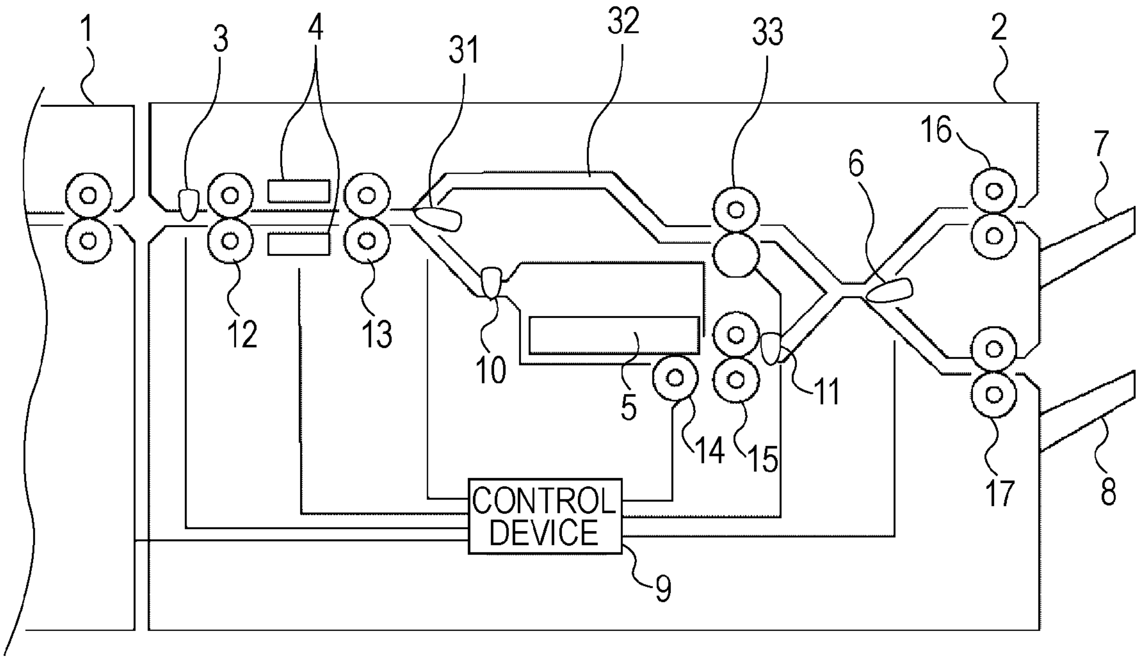
FIG. 8 is a cross-sectional view showing a brief configuration of an image inspecting apparatus with a rearrangement operation enabled.

In this embodiment, to perform rearrangement of sheets asynchronously with reading and image inspection of the sheets, a configuration in FIG. 8 is employed. The configuration in FIG. 8 is mainly different from the configuration in FIG. 1 in that a re-printed-sheet conveying path 32, serving as a re-printed-sheet conveying path, is provided. In addition, since the re-printed-sheet conveying path 32 is provided, a conveying-path switch guide 31 and re-printed-sheet conveying rollers 33 are provided. Further, through not shown, a motor for driving the re-printed-sheet conveying rollers 33 and a circuit necessary for driving the conveying-path switch guide 31 are additionally provided.

Hereinafter, a second embodiment is described with reference to the drawings.

Figure 9:
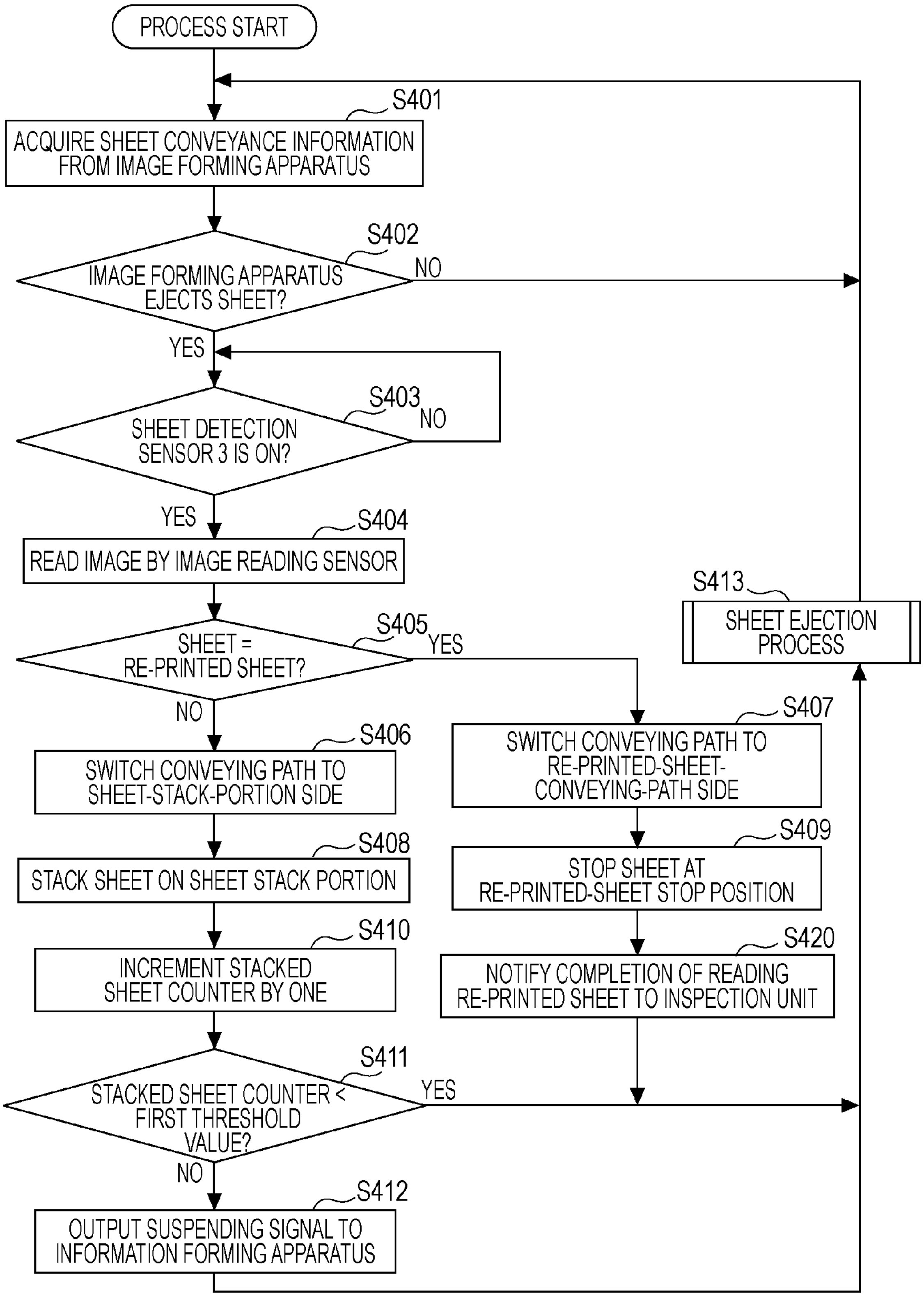
FIG. 9 is a flowchart showing a sheet stack process of a control device with the rearrangement operation enabled.

FIG. 9 is a flowchart showing a sheet stack process executed by a control device 9 according to the second embodiment. Steps S401 to S404 are similar to steps S101 to S104 in FIG. 4. The control device 9 determines whether or not the sheet read in step S404 is a re-printed sheet on the basis of the information from the image forming apparatus 1 (S405). If the read sheet is not a re-printed sheet, the control device 9 switches the conveying-path switch guide 31 to the sheet-stack-portion 5 side (S406). Subsequent steps S408, and S410 to S412 are similar to steps S105 to S108 in FIG. 4. If the read sheet is a re-printed sheet, the control device 9 switches the conveying-path switch guide 31 to the re-printed-sheet-conveying-path 32 side, to guide the sheet to the re-printed-sheet conveying path 32 (S407), and stops the sheet at the position of the re-printed-sheet conveying rollers 33 (S409). Further, the control device 9 notifies that the read sheet is the re-printed sheet, to the inspection unit 19 (S420). When the inspection unit 19 receives the notification, the inspection unit 19 inspects the image of the re-printed sheet in priority to sheets already stacked on the sheet stack portion 5. The re-printed sheet stopped at the position of the re-printed-sheet conveying rollers 33 waits at this position until the inspection is completed. Even when the image inspecting apparatus 2 is in the middle of the image inspection of the re-printed sheet, the image forming apparatus 1 continuously ejects sheets. Hence, the subsequent sheets other than the re-printed sheet are read by the image reading sensor 4, and then stacked on the sheet stack portion 5.

Figure 10:
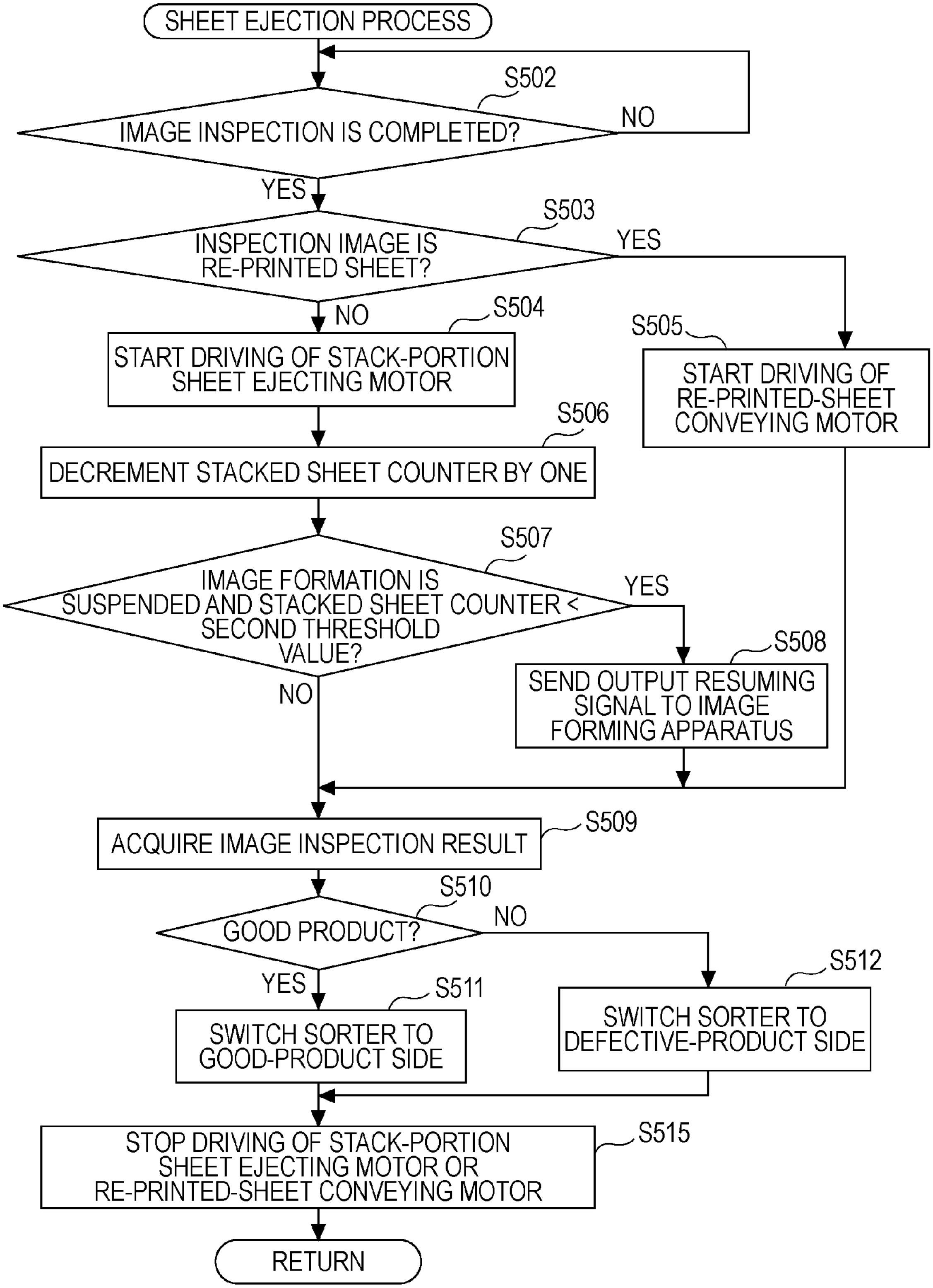
FIG. 10 is a flowchart showing a sheet ejection process of the control device with the rearrangement operation enabled.

FIG. 10 is a flowchart of a sheet ejection process in step S413. Similarly to step S202 in FIG. 5, the control device 9 determines whether or not the image inspection by the inspection unit 19 is completed (S502). If the image inspection is completed, the control device 9 determines whether or not the inspected image is the re-printed sheet (S503). Steps S504, and S506 to S515 performed by the control device 9 if the inspected image is not the re-printed sheet are similar to steps S203 to S210 in FIG. 5. If the inspected image is determined as the re-printed sheet by the determination in step S503, the control device 9 drives the re-printed-sheet conveying motor to convey the re-printed sheet stopped at the re-printed-sheet conveying rollers 33 (S505). Then, the procedure goes to step S509. Also, if the inspected image is the re-printed sheet, the control device 9 stops driving of the re-printed-sheet conveying motor in step S515.

Figure 11:
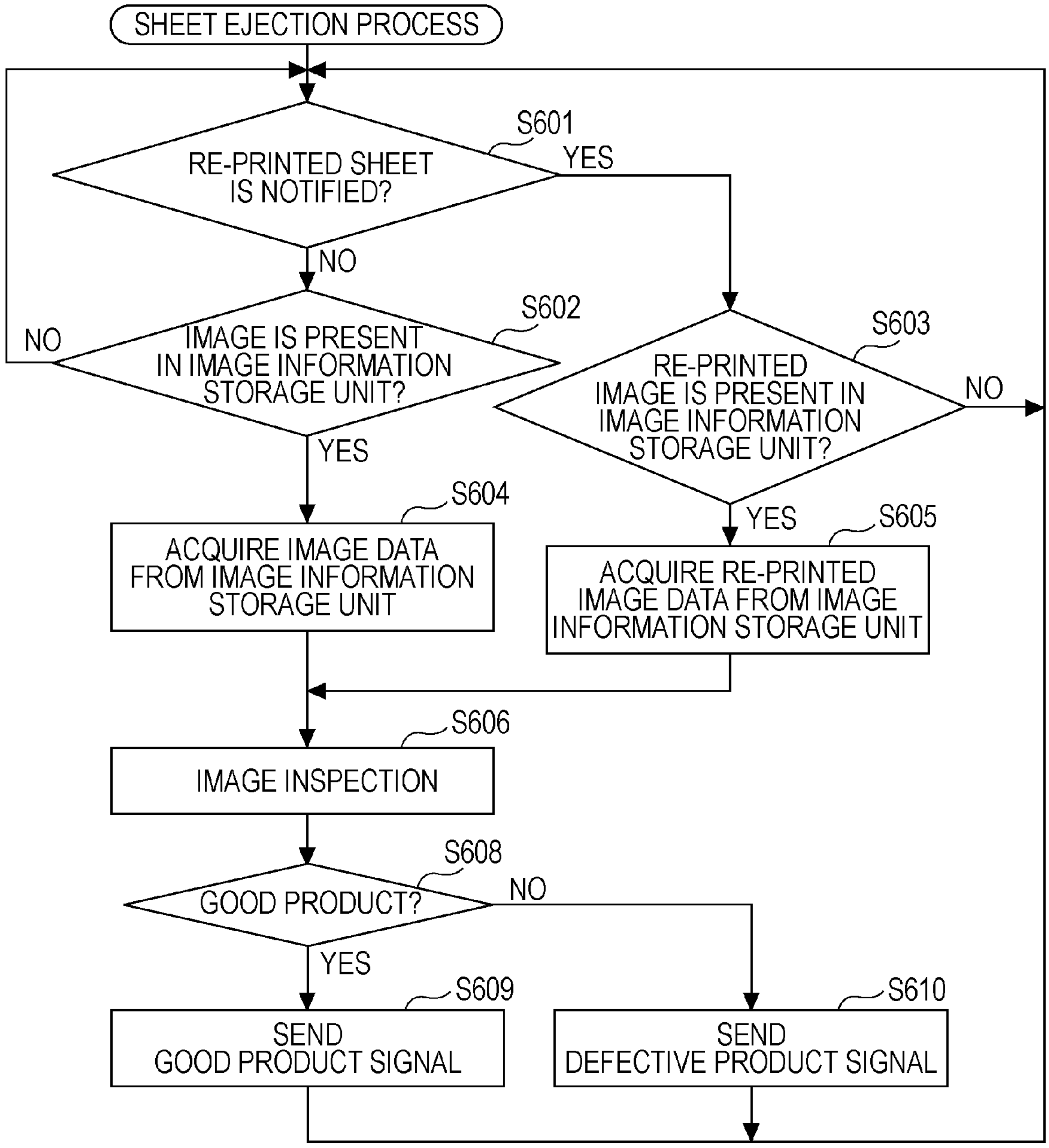
FIG. 11 is a flowchart showing a sheet inspection calculation process with the rearrangement operation enabled.

FIG. 11 is a flowchart showing an image inspection process according to the second embodiment. The inspection unit 19 determines whether or not the notification is provided from the control device 9 (S601), the notification indicating that the read image is the re-printed sheet. If no notification is provided, steps S602, S603, S606, and S608 to S610 are performed similarly to steps in FIG. 6. It is to be noted that step S606 corresponds to steps S303 to S310 in FIG. 6. If the notification of the re-printed sheet is provided in step S601, the inspection unit 19 determines whether or not the image of the re-printed sheet is present in the image information storage unit 20 (S603). If the image of the re-printed sheet is present, the inspection unit 19 acquires the image information of the re-printed sheet from the image information storage unit 20 via the compression/decompression unit 21 (S605). Then, the procedure goes to step S606.

Also, similarly to the first embodiment, when the image forming apparatus 1 acquires a re-printing request signal, the image forming apparatus 1 interrupts a job in a printing operation and executes re-printing of an image determined as a defective product.

Figure 12:
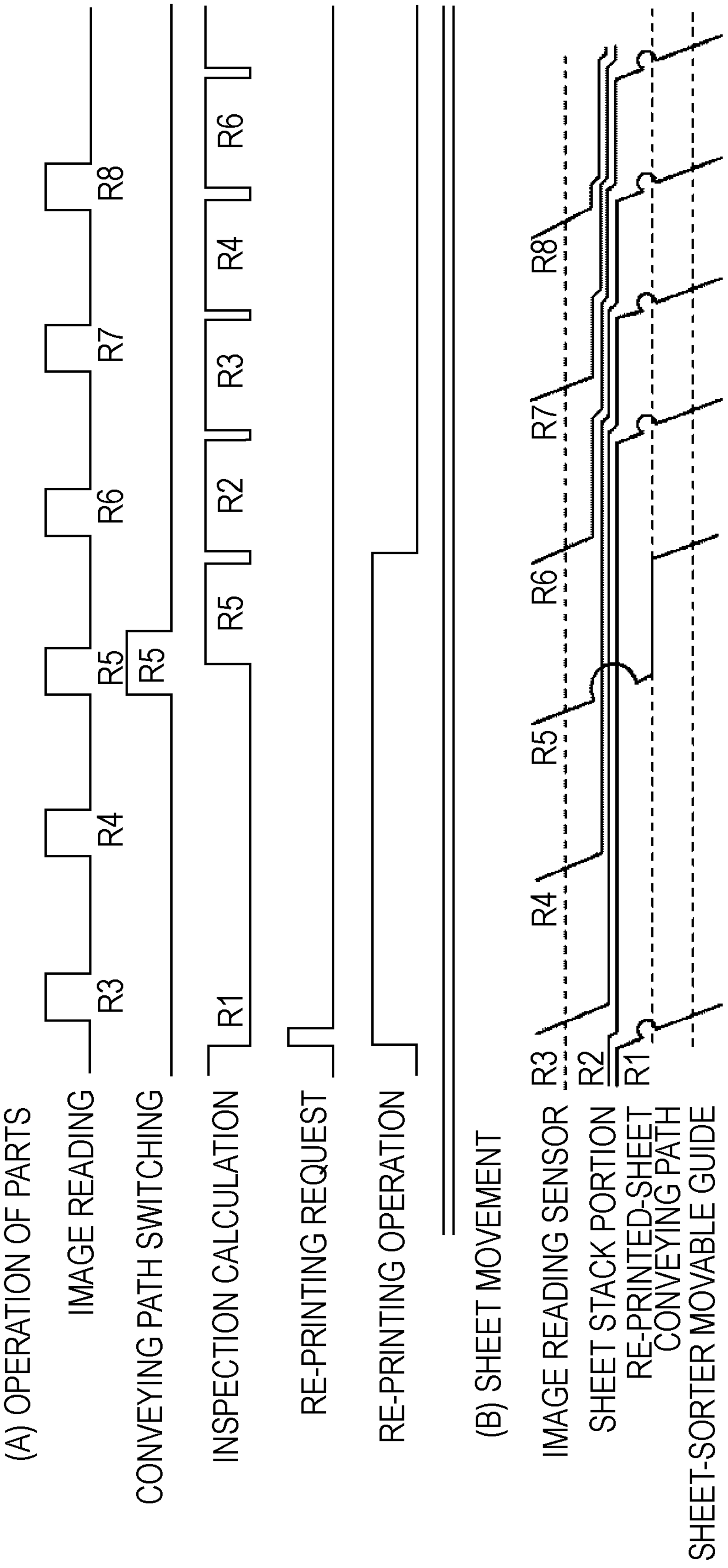
FIG. 12 is a timing chart showing the entire procedure of an image inspection process with the rearrangement operation enabled.

The procedure of the operation of the image inspecting apparatus 2 in the second embodiment is described with reference to a timing chart in FIG. 12. Reference characters R1 to R8 in FIG. 12 are provided to discriminate a plurality of sheets to correlate the sheets with movement of the respective parts in a similar manner to FIG. 7. FIG. 12 illustrates the operation of the respective parts and the movement of eight sheets. Section (A) of FIG. 12 represents the operation of the respective parts of the image inspecting apparatus 2. The item "image reading" represents a period in which the image reading sensor 4 reads an image on a sheet. The item "conveying path switching" represents a period in which the conveying-path switch guide 31 is switched to a re-printed-sheet-conveying-path 32 side. The item "inspection calculation" represents a period in which the inspection unit 19 performs an inspection calculation. The item "re-printing request" represents a timing at which the control device 9 outputs the re-printing request signal to the image forming apparatus 1. The item "re-printing operation" represents a period in which the image inspecting apparatus 2 performs processing to the re-printed sheet. In FIG. 12, first and second sheets R1 and R2 are stacked on the sheet stack portion 5. The inspection unit 19 inspects image information of the sheet R1. It is assumed that the image of the sheet R1 is a defective product. Since the image of the sheet R1 is a defective product, the image inspecting apparatus 2 sends the re-printing request signal to the image forming apparatus 1. After the image forming apparatus 1 receives the re-printing request signal, the image forming apparatus 1 ejects third and fourth sheets R3 and R4, and then ejects a re-printed sheet R5 (re-printing of the sheet R1). Then, the image forming apparatus 1 ejects sheets R6 to R8 continuously. The sheets R3 and R4 are stacked on the sheet stack portion 5. Since the sheet R5 is the re-printed sheet, the conveying path is switched, and the sheet R5 is conveyed to the re-printed-sheet conveying path 32. The inspection unit 19 provides priority inspection to the image of the re-printed sheet R5. If the inspection result is a good product, the inspection unit 19 inspects images of the sheets R2 to R4, and R6 to R8.

With the second embodiment, even when a defective image is produced, the re-print process and the rearrangement process are performed, and hence sheets are ejected in the correct page order. Further, even when the image inspecting apparatus 2 is in the middle of the processing of the re-printed sheet, the image inspecting apparatus 2 can receive subsequent sheets. The image forming apparatus 1 can continuously perform the operation.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-078276 filed Mar. 25, 2008, which is hereby incorporated by reference herein in its entirety.

What is claimed is:

1. An image inspecting apparatus configured to inspect an image formed on a sheet ejected from an image forming unit, the image inspecting apparatus comprising:

a receiving unit configured to receive the sheet ejected from the image forming unit;

a reading unit configured to read the image formed on the sheet received by the receiving unit;

an inspection unit configured to inspect the image read from the sheet by the reading unit;

a sheet stack portion into which a plurality of sheets that are received from and read by the reading unit are stacked and configured to eject a stacked sheet from there to a tray, wherein a first sheet is stacked, before the inspection unit completes inspection of a read image from the first sheet, into the sheet stack portion temporarily to obtain time for the inspection unit that allows the inspection unit to complete inspecting the read image from the first sheet before the sheet stack portion ejects the stacked first sheet to the tray and without the image inspecting apparatus suspending a continuous image forming operation being performed by the image forming unit; and a control unit configured to output, in response to the plurality of sheets in the sheet stack portion reaching a number of sheets that is equal to a first predetermined value and before the sheet stack portion ejects a next stacked sheet, a sheet-ejection stop signal to the image forming unit, wherein the control unit outputs, in response to the plurality of sheets in the sheet stack portion first reaching the number of sheets that is equal to the first predetermined value and then falling to a number of sheets that is equal to a second predetermined value, a sheet-ejection resumption signal to the image forming unit, and acquires, after outputting the sheet-ejection resumption signal, image inspection results from the inspection unit.

2. The image inspecting apparatus according to claim 1, further comprising:

a storage unit configured to store images of a plurality of sheets, wherein the storage unit stores the image from the first sheet read by the reading unit and the inspection unit inspects the image from the first sheet read by the reading unit and stored in the storage unit, wherein the reading unit reads a front surface and a back surface of the sheet.

3. The image inspecting apparatus according to claim 1, wherein the sheet stack portion stacks the first sheet received by the receiving unit, and then the reading unit reads the first sheet after the first sheet has been ejected from the sheet stack portion.

4. The image inspecting apparatus according to claim 1, further comprising:

a sorting unit configured to sort sheets ejected from the sheet stack portion to one of a first tray and a second tray, wherein the control unit further is configured to control the sorting unit in accordance with an inspection result of the inspection unit.

5. The image inspecting apparatus according to claim 4, wherein the inspection unit determines whether the image is one of a non-defective product and a defective product, and the control unit controls the sorting unit such that a sheet having an image determined as the non-defective product by the inspection unit is stacked on the first tray and a sheet having an image determined as a defective product is stacked on the second tray.

6. The image inspecting apparatus according to claim 1, wherein the control unit further is configured to output, to the image forming unit, a re-printing signal that causes an image determined as a defective product by the inspection unit to be formed again on a sheet.

7. The image inspecting apparatus according to claim 6, wherein, after the reading unit reads a sheet having the image formed again in response to the re-printing signal, the control unit controls the inspection unit to inspect the sheet having the image formed again in priority to an image formed on other sheet.

8. The image inspecting apparatus according to claim 7, further comprising:

a sorting unit configured to sort sheets ejected from the sheet stack portion to one of a first tray and a second tray; and a conveying unit configured to convey, after the reading unit reads the sheet having the image formed again in response to the re-printing signal, the sheet having the image formed again to the sorting unit without stacking the sheet on the sheet stack portion, wherein the control unit stops ejection of sheets stacked on the sheet stack portion until after the conveying unit conveys the sheet having the image formed again to the sorting unit.

9. The image inspecting apparatus according to claim 8, wherein, after the reading unit reads the sheet having that image formed again in response to the re-printing signal, the control unit stops the ejection of sheets stacked on the sheet stack portion until after the inspection unit determines the image formed again on the sheet as a non-defective product.

10. The image inspecting apparatus according to claim 1, wherein the second predetermined value is smaller than the first predetermined value by an amount that prevents intermittent suspension of sheet-ejection.

11. The image inspecting apparatus according to claim 1, wherein the reading unit reads an image form on a second sheet before the inspection unit completes inspecting the read image from the first sheet, whereby the image inspecting apparatus does not suspend a continuous image forming operation being performed by the image forming unit, even when an image inspecting speed is variable and slower than a predetermined interval between reading images, so long as the plurality of sheets in the sheet stack portion does not reach the number of sheets that is equal to the first predetermined value.

12. The image inspecting apparatus according to claim 11, wherein the predetermined interval between reading images by the reading unit is independent of inspection intervals between inspections of read images by the inspection unit.

13. The image inspecting apparatus according to claim 1, wherein the control unit further is configured to determine an image range as inspection subject on a sheet based on detection timing of the sheet by the receiving unit.

14. The image inspecting apparatus according to claim 1, wherein the sheet stack portion ejects only one stacked sheet at a time from the plurality of sheets to the tray, wherein each one stacked sheet is ejected only after the inspection unit completes an inspection of an image read by the reading unit.

15. The image inspecting apparatus according to claim 14, wherein the sheet stack portion stacks each sheet received from the reading unit on a top of the plurality of sheets and ejects a bottom sheet from a bottom of the plurality of sheets to the tray, wherein, while the inspection unit inspects an image corresponding to a second sheet, the sheet stack portion receives the second sheet and receives a third sheet before completing inspection of the image corresponding to the second sheet and before ejecting the second sheet to the tray.

16. The image inspecting apparatus according to claim 1, further comprising:

the tray, wherein the tray is configured to receive sheets from the sheet stack portion so that the sheets are outside of the image inspecting apparatus, and wherein the sheet stack portion temporarily stacks sheets inside the image inspecting apparatus.

17. The image inspecting apparatus according to claim 1, wherein the sheet stack portion receives a mixture of sheets, wherein the mixture of sheets includes a sheet having an image subsequently determined as a defective product and a sheet having an image subsequently determined as a non-defective product, and wherein the sheet stack portion is configured eject one of the sheet having an image subsequently determined as a defective product and the sheet having an image subsequently determined as a non-defective product to the tray as a first tray and eject other of the sheet having an image subsequently determined as a defective product and the sheet having an image subsequently determined as a non-defective product to a second tray.

18. The image inspecting apparatus according to claim 1, wherein the inspection unit begins inspecting a second image formed on a second sheet and read by the reading unit before the reading unit completes reading the second image formed on the second sheet.

19. A method for an image inspecting apparatus configured to inspect an image formed on a sheet ejected from an image forming unit, the method comprising:

receiving the sheet ejected from the image forming unit;

reading the image formed on the received sheet;

inspecting the image read from the sheet and;

stacking, before completing inspection of a read image from a first sheet, the first sheet into a sheet stack portion temporarily to obtain time for the inspecting that allows the inspecting to complete inspecting the read image from the first sheet before ejecting the stacked first sheet from the sheet stack portion to a tray and without the image inspecting apparatus suspending a continuous image forming operation being performed by the image forming unit; and outputting, in response to the plurality of sheets in the sheet stack portion reaching a number of sheets that is equal to a first predetermined value and before the sheet stack portion ejects a next stacked sheet, a sheet-ejection stop signal to the image forming unit, wherein outputting includes outputting, in response to the plurality of sheets in the sheet stack portion first reaching the number of sheets that is equal to the first predetermined value and then falling to a number of sheets that is equal to a second predetermined value, a sheet-ejection resumption signal to the image forming unit, and acquires, after outputting the sheet-ejection resumption signal, image inspection results.

* * * * *